Jan. 29, 1963 R. F. JACK ETAL 3,075,280

METHOD OF MAKING PRINTED WIRING ASSEMBLIES

Filed Oct. 19, 1959 2 Sheets-Sheet 1

INVENTORS R. F. JACK
R. E. PRESCOTT
P. R. WHITE

BY George S. Indig

ATTORNEY

METHOD OF MAKING PRINTED WIRING ASSEMBLIES

Filed Oct. 19, 1959 2 Sheets-Sheet 2

INVENTORS R. F. JACK
R. E. PRESCOTT
P. R. WHITE
BY George S. Indig
ATTORNEY

United States Patent Office 3,075,280
Patented Jan. 29, 1963

3,075,280
METHOD OF MAKING PRINTED WIRING ASSEMBLIES

Robert F. Jack, Meyersville, Robert E. Prescott, Bernardsville, and Philip R. White, Murray Hill, N.J., assignors to Bell Telephone Laboratories, Incorporated, New York, N.Y., a corporation of New York
Filed Oct. 19, 1959, Ser. No. 847,290
9 Claims. (Cl. 29—155.5)

This invention relates to a method of fabricating printed wiring boards.

Printed wiring boards, or printed circuits as they are sometimes called, are finding increased use in electrical devices by virtue of their compactness and low cost. The usual prior art types of printed wiring boards generally consisted of an array of conducting paths appropriately situated on an insulating base, with provision being made for attachment of components such as transistors and printed capacitors.

It is essential that the conducting path of a printed wiring board be firmly bonded to the insulating base. Such bond is desirably temperature insensitive to avoid defects which would otherwise occur as a result of repeated soldering operations. Also, the difference in the coefficients of expansion of the conducting medium and the insulating base should be small so as to minimize structural failure during operation. Another important consideration is the conductivity which is required, a high conductivity metal such as copper or silver generally being used to meet this requirement. In certain instances where the insulating base is necessarily thin or flexible, the ductility of the conducting path becomes important. In such cases, it is desirable that the conducting path medium have a low modulus of elasticity and a relatively high flexural strength to permit the conducting path to follow the distortions of the insulating base without fracturing.

A printed wiring assembly possessing the three attributes discussed above may be fabricated in accordance with the present invention. The inventive method utilizes a metal in particle form to produce the conducting path. The insulating base is then formed in direct contact with the prefabricated conducting path, thereby assuring the firmness of bond necessary in this type of structure.

The inventive method requires the fabrication of a die which is recessed in accordance with the design of the printed circuit path desired. The recesses of the die are then filled with a metal powder. The filled recesses are then leveled, for example, by scraping a doctor blade across the face of the die.

The metal particles are then compressed. A layer of a relatively incompressible material which will flow under pressure, such as, for example, a sheet of rubber, is placed in contact with the die face. The rubber sheet and the die are then conveniently placed in an enclosed space and the sheet forced against the die, for example, by means of a hydraulic press. The incompressible medium flows under the applied pressure and exerts a force against the particles in the recesses. In this manner, the particles are compressed by a pressure essentially equal to the pressure applied to the die face. The surface of the compressed metal mass which is in contact with the die is relatively smooth, whereas the surface of the mass in contact with the incompressible medium is relatively rough and uneven. The excellent bonding which is achieved in accordance with the inventive method is directly attributable to the rough uneven surface of the sintered conducting path which affords a high degree of interlocking between the insulating base and metal surfaces.

The next step in the preparation of the conducting path consists of sintering the compressed metal particles at a temperature sufficient to form a unitary, integral structure in the desired conductor configuration. This sintering procedure imparts a high degree of conductivity as well as increasing the mechanical strength of the conducting path. This step also functions as an anneal which increases the ductility of the conducting path to a relatively high level.

The last step of the inventive process involves forming an insulating base in contact with the conducting path. A convenient method of achieving this involves use of compression molding techniques. To this end, the die containing the sintered conducting path is placed in a compression molding compartment. The compartment is then filled with a plastic molding powder, such as, for example, a thermosetting phenolic resin, which contacts the die face and the sintered conducting path. The plastic molding powder is then molded in accordance with conventional compression molding techniques. Other methods of fabricating the insulating base are suitable and are discussed in detail below.

The invention will be more readily understood when taken in conjunction with the following drawings in which.

Figure 1:
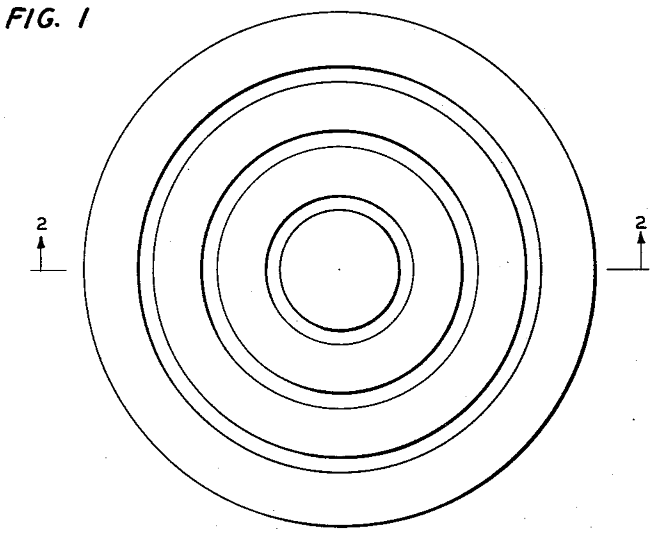
FIG. 1 is a plan view of a die used in the fabrication of a printed circuit wiring board in accordance with the present invention.

With respect now to FIG. 1, there is depicted a plan view of a die 1 having three concentric grooves 2, the latter representing the conducting path of the desired printed circuit. Die 1 is typically constructed of a hard steel of the type conventionally employed in compression molding processes.

Figure 2:
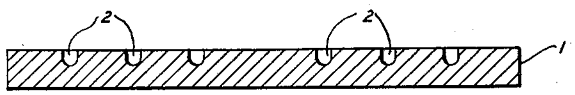
FIG. 2 is a cross-sectional view of the die depicted in FIG. 1.

FIG. 2 is a cross-sectional view of die 1 showing the shape of grooves 2, which may be of the order of 50 mils wide and 50 mils deep. The cross-sectional configuration of the grooves may be varied over a considerably wide range to fit the conductivity requirements of the printed circuit. Use of a metal having a poorer conductivity than, for example, copper, will necessitate increasing the cross-sectional area of the grooves in order to maintain conductivity at the desired level. Such grooves may be made as small as 20 mils wide and 15 mils deep without loss of the excellent bonding characteristics obtained by the inventive method.

Figure 3:
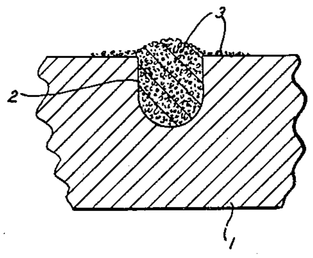
FIG. 3 is a cross-sectional view of a portion of the die of FIG. 1 which has been filled with a metal powder in accordance with the present invention.

The first step in the fabrication of the conducting path involves filling the grooves with metal particles. FIG. 3 is an enlarged cross-sectional view of a portion of die 1 and depicts the groove 2 filled with metal particles 3. As discussed in detail below, the inventive method dictates that the metal particles used have certain physical and chemical characteristics. After filling grooves 2 with metal particles, the excess particles are removed, for example, by scraping a doctor blade across the surface of die 1.

The next step consists of compressing the particles. This step is not straightforward because of the fact that the particles to be compressed are located in grooves and pressure must be applied below the land area of die 1. A convenient method of compressing the particles is based on the principle that equalization of pressure results in a closed system filled with an incompressible fluid. Thus, a practical method of achieving compression of the particles involves placing the die within a steel cylinder, covering the face of the die including the grooves with an incompressible material such as, for example, a sheet of rubber, and then placing this assembly in a hydraulic press. Pressure is applied by forcing a close-fitting steel ram into the steel cylinder so as to contact and press the rubber sheet against the die. Since the rubber is confined to the space bounded by the steel cylinder, die, and ram, it flows in a manner which equalizes the pressure within the enclosed system.

Figure 4:
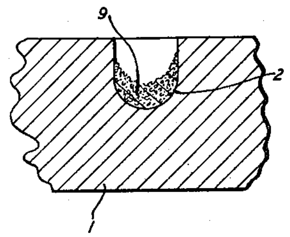
FIG. 4 depicts the section shown in FIG. 3 following compression of the metal powder.

FIG. 4 is an enlarged cross-sectional view of a portion of die 1 showing the effect of the compression step on the particles in the grooves. Shown in FIG. 4 is a portion 9 of the compressed conducting path. Use of the above-described means of compressing the particles is advantageous also in that the surface of the compressed particle mass which was in contact with the incompressible medium is rough and uneven, thereby affording an excellent basis for a firm mechanical bond to the insulating base which is subsequently to be molded. This is a very important consideration since a surface having the smoothness of, for example, the face of the compressed particle mass which is in contact with the die would not lend itself to the formation of a strong mechanical bond to the insulating base.

The compressed particle mass is then sintered to cause the particles to coalesce and form an integral structure in the desired conductor configuration. This step provides both the high conductivity and structural strength required in printed wiring boards. The sintering step is generally conducted in an atmosphere which will promote coalescence of the particles into an integral mass. Thus, for example, copper particles may be effectively sintered in a reducing atmosphere at a temperature of the order of 400° C., well below the melting point of copper, which is approximately 1100° C.

Figure 5:
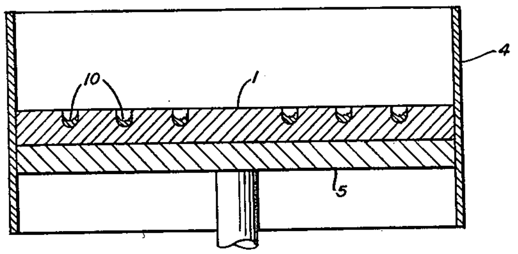
FIG. 5 is a schematic cross-sectional view of a compression molding compartment in which has been placed the die of FIG. 1 containing compressed metal powder.

The final steps in the preparation of a printed wiring assembly in accordance with this invention involve the fabrication of the insulating base. This is conveniently accomplished by utilizing customary compression molding techniques. FIG. 5 depicts die 1 containing sintered conducting path 10 disposed in cylinder 4 which comprises one part of a typical compression molding apparatus. Plunger 5 serves as a support for die 1.

Figure 6:
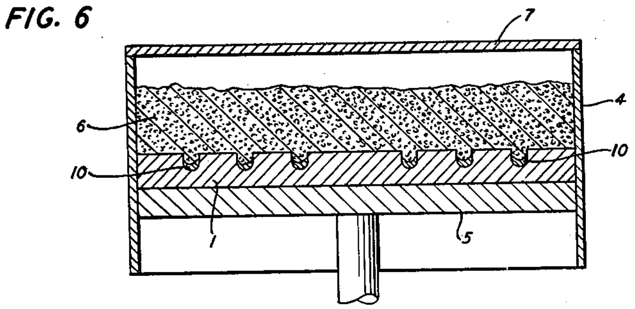
FIG. 6 is a cross-sectional view of the compression molding compartment shown in FIG. 5 which has been sealed following addition of molding powder.

In this illustrative example, the exposed face of die 1 is then covered with an appropriate quantity of a plastic molding powder. FIG. 6 depicts the assembly shown in FIG. 5 after molding powder 6 has been introduced and the system sealed by means of plate 7. Pressure is then applied to the die and molding powder through plunger 5.

Figure 7:
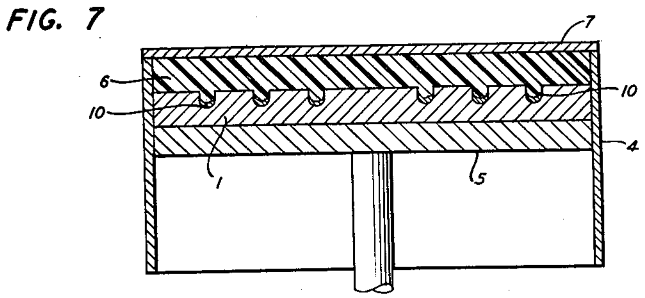
FIG. 7 depicts the assembly shown in FIG. 6 following the molding step.

FIG. 7 depicts the compression molding apparatus after the application of the necessary molding pressures. The plastic and die are maintained under pressure for a period of time dictated by the particular plastic material employed. Thus, for example, if a thermosetting resin is used, sufficient time must be allowed for the cross linkages to form, thereby imparting rigidity to the molded base. On the other hand, if a thermoplastic material is used, the mold must be cooled to solidify the molded base prior to its removal from the mold.

Figure 8:
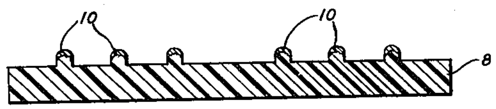
FIG. 8 is a cross-sectional view of a printed wiring assembly produced in accordance with the present invention.

FIG. 8 is a cross-sectional view of the completed printed wiring assembly 8 fabricated in accordance with the above-described process.

The suitability of a particular metal as the conducting path in a printed wiring board fabricated in accordance with this invention is dependent on many factors including, for example, the strength and ductility of the sintered structure, electrical conductivity, solderability of the exposed surface of the conducting path, level of pressure and sintering temperature required to produce a conductive, cohesive mass, and lastly, the basic cost of the metal itself. Judged on the basis of the above-named considerations, copper is considered a preferred metal for this use. Accordingly, the following detailed discussion is in terms of copper, although it is to be understood that metals including silver, tin, lead, bronze, solder, nickel, gold, iron, aluminum, platinum and others may be satisfactorily employed.

The particle size distribution of the copper powder used to produce the conducting path in accordance with this invention is determinative of certain important characteristics of the finished conducting path. It has been determined that copper powder consisting essentially of minus 200-mesh yields optimum results when used in the present inventive method. As the proportion of particles finer than 200-mesh is increased, the surface of the conducting path in contact with the die contains a higher degree of smoothness, a desirable result. However, the surface in contact with the incompressible medium, which surface is subsequently contacted with the plastic insulating base, becomes less rough and less uneven, thereby decreasing the strength of the bond subsequently formed to the plastic base. For this reason, it is preferable that a powder of an average fineness not less than 325-mesh be used.

As would be expected, increasing the particle size of the copper powder above 200-mesh tends to reduce the smoothness of the face of the conducting path which is formed in contact with the die. Furthermore, the strength of the conducting path tends to decrease as particle size increases by virtue of the statistically decreasing number of metal to metal contacts between particles of larger size. Accordingly, a preferred upper limit of particle size is approximately 100-mesh.

The manner in which the copper powder is produced also has an effect upon the properties of the finished conducting path. Copper powders produced by two entirely different procedures are currently commercially available, one type being produced by atomization of molten copper and the other being produced by crushing electrolytically deposited copper. As would be expected, copper particles produced by atomization are spherical in shape, whereas those which result from a crushing or pulverizing procedure are randomly and irregularly shaped. It has been determined that the crushed electrolytic powder is preferred for use in the present invention by reason of the high strength and ductility of conducting paths so fabricated.

The higher strength and ductility of conducting paths produced from pulverized electrolytic powder is attributable to the fact that the density of the compressed particle mass is higher by reason of the random shapes of the particles. There are less void spaces in such compressed masses as compared with those produced from atomized particles and accordingly strength and ductility of the finished path is higher. The increased strength and ductility of the conducting paths produced from pulverized particles are referable to the superior packing characteristics of random-shaped particles. The number of metal-to-metal contacts in a mass of spherically-shaped atomized particles is substantially lower than would be expected from a mass of pulverized particles of the same average size and accordingly the tensile strength and ductility are reduced.

The pressing step of the present invention is preferably conducted at a pressure greater than 7000 pounds per square inch, the maximum pressure being determined by the mechanical strength of the materials and apparatus involved. In most instances such maximum pressure is of the order of 100,000 pounds per square inch. As discussed below, the pressure level necessary to produce a high quality conducting path is related to the temperature employed in a subsequent sintering step. Accordingly, for optimum results, a sintering temperature in the range of from approximately 400° C. to 600° C. should be used in conjunction with the preferred pressure range set forth above.

The incompressible medium employed in the compression step may be one of several materials having characteristics similar to the rubber used in the illustrative example described above. Thus, materials including lead or other soft metals, polyethylene or other plastic of a similar nature, and leather, which flow under applied pressure are well suited for use in this aspect of the present invention.

It is to be appreciated that the use of an incompressible material, such as those described above, as a pressure transmitting medium is merely an illustrative method of exerting the necessary pressure on the particles in the die. Other suitable procedures may be satisfactorily employed for this purpose.

The sintering step is conducted in a reducing atmosphere such as, for example, hydrogen. In this step, surface films of copper oxide are reduced, thereby permitting initiation of grain growth at the particle interfaces. As stated above, the use of pressures of the order of 7000 pounds per square inch or greater permits sintering to be conducted at temperatures in the range of from 400° C. to 600° C. Increasing the sintering temperature to the level of 700° C. to 800° C. allows for a decrease in pressure during the compression step to, for example, 5000 pounds per square inch. The interrelation of these two parameters is well known in the powder metallurgy art.

The choice of sintering temperature is also governed by other factors. Thus, for example, temperatures substantially higher than 600° C. may tend to anneal the steel die employed in the inventive process. To avoid such annealing, the use of expensive steel alloys is indicated. However, the use of higher sintering temperatures is advantageous in that the ductility of the conducting path is essentially directly proportional to the sintering temperature. It has been determined from the standpoint of conductivity, strength and ductility of the finished conducting path that sintering temperatures of the order of 400° C. to 600° C. are eminently satisfactory.

The present inventive method places no inherent limitation on the type of molding process used to fabricate the insulating base of printed wiring assemblies of this invention. Thus, although compression molding techniques were suggested in the illustrative example described above, other similar molding processes, such as injection molding and transfer molding, which utilize the same types of organic molding materials, may be successfully employed. It is to be appreciated that the particular molding powder or plastic composition used will depend largely on the properties required for the particular application. Thus, in accordance with well-known practice, thermosetting resins would be employed in those instances where the printed wiring assembly would be exposed to temperatures higher than ambient.

The insulating base may also be fabricated from laminated preforms. In such instances, it would be necessary to cause the surface of the preform which contacts the sintered conducting path to flow sufficiently so that a high quality bond is formed between the insulating base and the conducting path.

Other methods of producing the insulating base involve the use of casting resins, such as epoxies and low-melting glasses. The use of such materials would require only a suitable molding die appropriately prepared to receive the liquid insulating materials. In such instances the fact that the insulating base material is in liquid form when it contacts the conducting path assures the production of an excellent mechanical bond since it provides the type of interlocking which is peculiar to this invention.

A totally different type of insulating base may be fabricated in accordance with the ceramic fabricating techniques. Thus, for example, a green compact may be formed by molding ceramic raw materials in contact with the sintered conducting path. The fact that ceramic raw materials are usually in a finely divided state assures the formation of a strong mechanical bond. The ceramic is then sintered at an appropriate temperature in accordance with ceramic procedures. Fabrication of an insulting base of this type requires that the ceramic sintering temperature be compatible with the particular metal employed as the conducting path.

Fabrication of the insulating base subsequent to the formation of the conducting path, as taught in this invention, possesses an outstanding advantage over prior art methods. The insulating base may be molded in almost any configuration, thus permitting tailoring to fit a particular application. Furthermore, it is possible to produce an insulating base containing several printed circuits, each occupying a different face or surface of the insulating base. Thus, for example, fabrication of an insulating base in the shape of a cube would permit the use of all six faces as sites for printed circuits.

Another very important advantage inheres in the fact that lugs, binding posts or other irregular projections may be produced as an integral part of the insulating base. This facilitates attachment of the printed wiring circuit with a minimum of additional work. In many instances it is difficult, if not impossible, to make appropriate provision for attaching conventional printed wiring boards without allowing for extra working space.

In view of the foregoing discussion, it should be apparent that in many cases the printed wiring circuits produced in accordance with this invention will be other than the conventional rectangular-shaped "board." Accordingly, the phrase "printed wiring assembly" has been used in the specification above and in the claims following to denote the variations in shape and design which are afforded by the inventive method.

Although the illustrative example described above is in terms of particles of one metal, it is to be understood that mixtures of particles of various metals may be used to accomplish a desired end result. Also suitable for use in this invention are particles of one metal coated with another metal or alloy. In many instances, it may be desirable to utilize particles composed of an alloy of two or more metals. It is to be appreciated that the choice of composition of conducting path is dictated primarily by the electrical properties required in conjunction with powder metallurgy characteristics of metals involved.

The excellent bond between the conducting path and insulating base of wiring assemblies produced in accordance with the present invention permits tinning the conducting path by dipping the entire assembly into a bath of molten solder or equivalent. The property of temperature insensitivity possessed by assemblies of this invention also permits resoldering connections to the same general area of the conducting path without concern for any fractures or other harmful effects which would usually occur with prior art printed circuits.

Set forth below is a detailed example of the production of a printed wiring assembly in accordance with the present inventive method. Such example is to be considered as illustrative of the present invention, and it is to be understood that variations may be made by one skilled in the art without departing from the spirit and scope of this invention.

EXAMPLE

A die simulating an actual printed circuit design was constructed by producing three grooves approximately two inches long in a die approximately three inches in diameter. Each of the grooves was approximately 60 mils wide and 50 mils deep, the grooves having a rounded bottom and straight sides as would be produced by a 1/16 inch milling cutter. The grooves were parallel and spaced approximately 1/32 inch apart.

The grooves were filled with a copper powder consisting substantially of minus 200-mesh particles which was produced by screening crushed electrolytically deposited copper. A doctor blade was scraped across the surface of the die to remove excess copper particles.

The die was placed within a steel cylinder having an inside diameter approximately equal to the outside diameter of the steel die. A circular sheet of rubber approximately one-eighth inch in thickness having a diameter approximately equal to that of the die was placed in contact with the face of the die and the copper particles. The assembly was placed in a conventional hydraulic press and the rubber sheet was pressed against the face of the die under a pressure of approximately 8500 pounds per square inch. The rubber sheet was then removed from the die face.

The die containing the compressed particles was placed in an oven and heated to a temperature of approximately 500° C. in an atmosphere of essentially pure hydrogen for a period of approximately fifteen minutes. The die was removed from the oven and allowed to cool to room temperature.

The die containing sintered copper particles was then placed in a conventional compression molding compartment. A quantity of asbestos-filled phenolformaldehyde molding powder sufficient to produce a vase approximately one-eighth inch in thickness was added to the compartment. The compression molding compartment wa heated to a temperature of approximately 360° F. and pressure was then applied in the usual manner. The plastic and the die were mantained under pressure for a period of approximately six minutes to permit the resin to set. The pressure was then released and the die opened, yielding a printed wiring assembly of the type shown in FIG. 8.

The following tests were conducted on an assembly produced as described above.

*Conductivity Test*

The resistivity of the conducting path at approximately 70° F. was calculated to be approximately $9\times10^{-6}$ ohm-centimeter. The resistivity calculation was based on measurements of resistance and cross-sectional area measurements made in the conventional manner.

*Flexure Test*

A rectangular section approximately 2½ by 1½ inch was cut from the three-inch diameter assembly, the section containing the three conducting paths in their entirety. The conductors were electrically connected in series and a current of approximately 100 milliamperes passed therethrough. The section was then mechanically deformed by loading at the center while maintaining the extremities in a fixed position. The deformation rate was approximately .200 inch per minute.

Comparison of a stress-strain curve of the insulating base with continuous measurement of the current flowing through the circuit indicated that the current was sharply reduced at the point at which the insulating base failed.

*Thermal Cycling Test*

The assembly was cycled five times from a low temperature of approximately −78° C. to a high temperature of approximately 125° C. No evidence of failure of conductor or rupture of the conductor-insulating base bond was present.

What is claimed is:

1. The method of producing a printed wiring assembly comprising the steps of disposing metal particles having an average size of from about 100-mesh to about 325-mesh in a configuration corresponding to the conducting paths of the printed wiring board, compressing the metal particles under a pressure in the order of 5,000 p.s.i. to 100,000 p.s.i., sintering the compressed particles in a reducing atmosphere at a temperature of from approximately 400° C. to approximately 800° C., and molding an insulating base in direct contact with the sintered and compressed particles.

2. The method of claim 1 in which the said particles are disposed in the said configuration by placing them in recessed areas in a die, said recessed areas corresponding to the conducting paths of the printed wiring assembly.

3. The method of claim 2 in which said particles are copper.

4. The method of claim 2 in which compression of the particles comprises the steps of covering the die face containing the particles with a sheet of a pressure transmitting material that flows under pressure and exerts a force against said particles essentially equal to the pressure applied to said die face, restricting lateral movement of said pressure transmitting material beyond the perimeter of the die, pressing the said pressure transmitting material against the die face and causing the said material to flow into the said recessed areas thereby compressing the particles, said pressure transmitting material being then removed from said die face.

5. The method of claim 4 in which the said particles are copper.

6. The method of claim 5 in which the said particles are produced from electrolytically deposited copper.

7. The method of claim 6 in which the said particles are minus 200-mesh.

8. The method of claim 7 in which the said pressure transmitting material is subjected to a minimum pressure of 7000 pounds per square inch and the sintering step conducted at a temperature in the range of from 400° C. to 600° C. in a reducing atmosphere.

9. The method of claim 8 in which the molding of the said insulating base comprises the steps of placing the die containing the sintered particles in a compression molding compartment, introducing molding powder comprising a thermosetting resin into said compartment in contact with said die and said sintered particles, and subjecting the molding powder to heat and pressure, thereby molding the said base in contact with the said sintered particles.

References Cited in the file of this patent

UNITED STATES PATENTS

| | | |
|---|---|---|
| 1,895,519 | Peters | Jan. 31, 1933 |
| 2,172,243 | Goodnow et al. | Sept. 5, 1939 |
| 2,447,541 | Sabee et al. | Aug. 24, 1948 |
| 2,578,209 | Schwarz | Dec. 11, 1951 |
| 2,700,719 | Coler et al. | Jan. 25, 1955 |
| 2,721,153 | Hopf et al. | Oct. 18, 1955 |
| 2,777,162 | Banzhof | Jan. 15, 1957 |
| 2,925,645 | Bell | Feb. 23, 1960 |

OTHER REFERENCES

Goetzel: "Treatise on Powder Metallurgy," vol. II, 1950, pages 229–233, published by Interscience Publishers, Inc., New York, New York.

National Bureau of Standards Miscel. Pub. 192, "New Advances in Printed Circuits," November 22, 1948, pages 15–17.

Swiggett-Introduction to Printed Circuits, 1956, John F. Rider, Publisher, Inc., New York, N.Y., pages 2 and 60–71.